United States Patent
Berchtold et al.

(10) Patent No.: US 7,264,857 B2
(45) Date of Patent: Sep. 4, 2007

(54) CONSTRUCTIONAL UNIT AND METHOD FOR PRODUCING A CONSTRUCTIONAL UNIT OF THIS KIND

(75) Inventors: Lorenz Berchtold, Nuernberg (DE); Dietmar Kurzeja, Malsch (DE); Guenter Lugert, Regensburg (DE); Thomas Riepl, Regensburg (DE); Robert Ingenbleek, Kressbronn a.B. (DE)

(73) Assignee: Tyco Electronics Pretema GmbH & Co. KG, Niefern (DE)

( * ) Notice: Subject to any disclaimer, the term of this patent is extended or adjusted under 35 U.S.C. 154(b) by 340 days.

(21) Appl. No.: 10/801,753

(22) Filed: Mar. 16, 2004

(65) Prior Publication Data

US 2004/0241357 A1   Dec. 2, 2004

(30) Foreign Application Priority Data

Mar. 21, 2003   (DE) ............................... 103 13 835

(51) Int. Cl.
*B32B 45/00* (2006.01)
*B65D 41/00* (2006.01)

(52) U.S. Cl. .................... 428/34.1; 428/33; 220/359.1; 220/359.4; 220/361; 220/364; 220/612; 220/614; 220/214; 220/3.8

(58) Field of Classification Search ............... 428/34.1, 428/33; 220/359.1, 359.4, 361, 364, 612, 220/614, 214, 3.8
See application file for complete search history.

(56) References Cited

U.S. PATENT DOCUMENTS

| | | | | |
|---|---|---|---|---|
| 3,637,551 A | * | 1/1972 | Sprauer | 528/339.3 |
| 3,995,613 A | * | 12/1976 | Patil | 126/704 |
| 4,337,709 A | * | 7/1982 | Nicholson | 108/33 |
| 5,399,805 A | * | 3/1995 | Tyler et al. | 174/52.4 |
| 6,202,786 B1 | * | 3/2001 | Pfaffelhuber et al. | 181/286 |

* cited by examiner

*Primary Examiner*—B. Hamilton Hess
*Assistant Examiner*—Lawrence Ferguson
(74) *Attorney, Agent, or Firm*—Barley Snyder LLC

(57) ABSTRACT

A constructional unit has a frame and a cover. The frame and the cover are formed of materials with different coefficients of thermal expansion. A plurality of spacers is arranged between the frame and the cover and defines a gap therebetween. An adhesive is provided in the gap to attach the frame to the cover and simultaneously seal the gap.

20 Claims, 1 Drawing Sheet

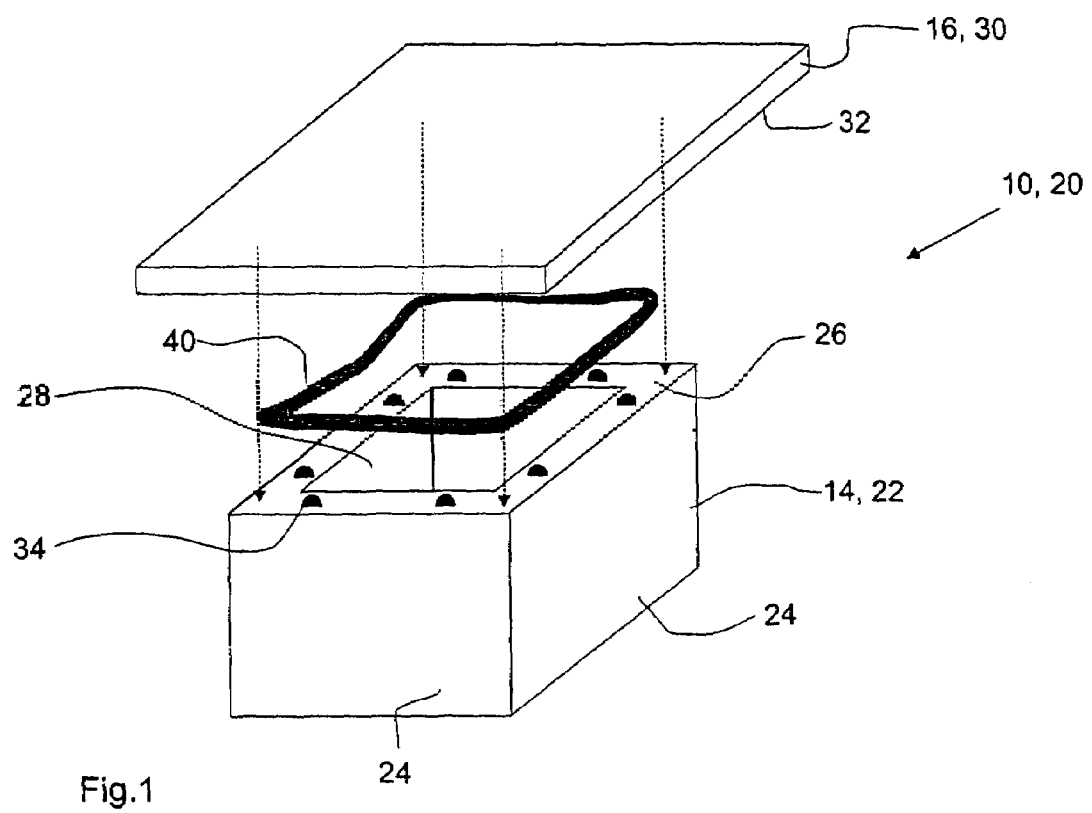
Fig.1
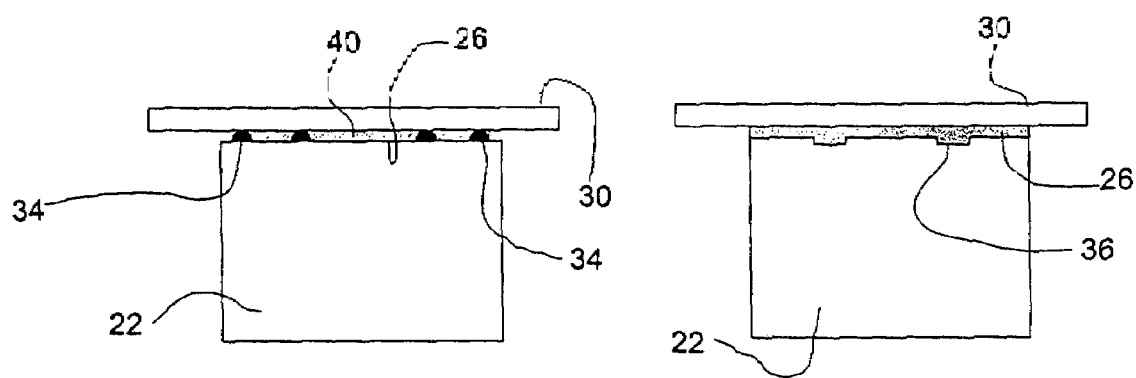
Fig. 2
Fig. 3

CONSTRUCTIONAL UNIT AND METHOD FOR PRODUCING A CONSTRUCTIONAL UNIT OF THIS KIND

FIELD OF THE INVENTION

The invention relates to a constructional unit, such as a housing, having a frame and a cover with different coefficents of thermal expansion wherein the frame and the cover are simultaneoulsy connected and sealed with an adhesive. The invention further relates to a method for producing the same.

BACKGROUND OF THE INVENTION

In many sectors of technology, particularly in the automobile sector, constructional units, such as housings, are hermetically sealed to protect components housed therein. In the automobile sector there is especially a need for housings that are resistant to chemicals and are sealed to fluids, such as water, oil, fuel, etc., even when the housings are exposed to large variations in temperature. It is also necessary to dissipate heat from inside the housing, if any of the components housed within the housing are heat-generating components, such as electronic circuits. To remove heat from inside the housing, one face of the housing is generally constructed as a metal plate. The metal plate is thermally coupled to the heat-generating components and acts as a heat sink. The remainder of the housing is generally made of a plastic material, because forming the entire housing out of metal is expensive and complicated. Because plastic and metal have different coefficients of thermal expansion, however, the seal between the plastic and the metal deteriorates when the housing is exposed to large variations in temperature.

To address the deterioration of the seal between the metal plate and the plastic portion of the housing, it is known to provide strips of an elastic material, such as silicone, between the plastic portion of the housing and the metal plate. The elastic material is positioned between the plastic portion of the housing and the metal plate, and then the metal plate is fastened to the plastic portion of the housing by a screw or other clamping means, which presses the metal plate into the elastic material. Positive-locking means, such as groove and tongue connections, are also used to improve the quality of the seal between the plastic portion of the housing and the metal plate. This method of fastening and sealing, however, is complicated, requires additional production steps, and is expensive.

SUMMARY OF THE INVENTION

It is therefore an object of the invention to develop a constructional unit, particularly a housing, with the aforementioned properties that can be more cost efficiently produced.

This and other objects are achieved by a constructional unit having a frame and a cover. The frame and the cover are formed of materials with different coefficients of thermal expansion. A plurality of spacers is arranged between the frame and the cover and defines a gap therebetween. An adhesive is provided in the gap to attach the frame to the cover and simultaneously seal the gap.

This and other objects are further achieved by a constructional unit having a frame and a cover. The frame and the cover are formed of materials with different coefficients of thermal expansion. An adhesive is provided between the frame and the cover that attaches the frame to the cover and seals a region between the frame and the cover. The region has indentations that provide repositories for the adhesive.

This and other objects are still further achieved by a method for sealing a constructional unit. The method includes providing a frame and a cover formed of materials with different coefficients of thermal expansion. A predetermined amount of an adhesive is applied to the frame or the cover. The frame is attached to the cover via the adhesive so that a seal is formed therebetween.

BRIEF DESCRIPTION OF THE DRAWINGS

FIG. 1 is a schematic perspective view of a first embodiment of a constructional unit according to the invention;

FIG. 2 is a schematic side view of the constructional unit shown in FIG. 1; and FIG. 3 is a schematic side view of an alternate embodiment of the constructional unit.

DETAILED DESCRIPTION OF THE INVENTION

FIG. 1 shows a first embodiment of a constructional unit 10. The constructional unit 10 comprises a frame 14 and a cover 16. The term "frame" as used herein is to be understood as a structure that has at least one face that defines an opening wherein the cover 16 is attached to the face. The frame further has side walls 24 that can be connected to a housing member (not shown) so that a self-contained housing is produced. Alternatively, the side walls can themselves form a housing member 22. The term "cover" as used herein is to be understood as a structure that covers the opening defined by the face.

As shown in FIG. 1, the constructional unit 10 illustrated herein is formed as a housing 20, which can accommodate electronic components, such as a gear control device. The frame 14 of the housing 20 is formed as the essentially pot-shaped rectangular housing member 22. The housing member 22 has a base (not shown) and the side walls 24. The side walls 24 and the base (not shown) form an opening 28 that extends from a face 26 of the frame 14 into an interior of the frame 14. Spacers 34 are formed on the face 26. The spacers 34 are evenly distributed over the face 26 and extend upward and perpendicular thereto. The housing member 22 is made from a plastic material by injection moulding. The frame 14 could also be, for example, constructed as a component of the housing member 22. Additionally, the frame 14 could be any desired shape, and the opening 28 could be any variety of shapes and sizes. Heat-generating components (not shown) may be accommodated in the opening 28 of the housing member 22.

As shown in FIG. 1, the cover 16 is formed as a lid 30. The lid 30 has a flat bottom surface 32. The bottom surface 32 is formed to extend essentially parallel to the face 26 and has a dimension such that it covers the opening 28 when the lid 30 is attached to the housing member 22 at the face 26. The lid 30 is made from a metal material. The heat-generating components (not shown) that are accommodated in the housing member 22 may be thermally coupled to the lid 30. The lid 30 thereby conveys heat from the interior of the housing 20 to the exterior of the housing 20 by acting as a heat sink.

As shown in FIG. 1, an adhesive 40 is arranged between the lid 30 and the housing member 22. The adhesive 40 is a hot-melt adhesive. The hot-melt adhesive is elastic and has optimal sealing characteristics so that the adhesive 40 is capable of sealing the housing 20 and absorbing stress from shearing forces occurring during thermal expansion of the housing member 22 and the lid 30. The hot-melt adhesive, depending on the case of application, should be oil-resistant and capable of withstanding temperatures as low as minus 40° C. Adhesive properties of the hot-melt adhesive do not play a dominant role with respect to the sealing quality and elasticity. The hot-melt adhesive may be a one-component material or a two-component material. The two-component material enables the temperature of use to be above the processing temperature of the hot-melt adhesive. Additionally, reactively cross-linking two-component hot-melt adhesives or polyamide based hot-melt adhesives can be used. The polyamide based hot-melt adhesives are particularly favourable for their chemical resistance properties, in particular to oil, flexibility even at high minus temperatures, processing ability, and elasticity. Other adhesives can also be used, which after hardening have the aforementioned properties. These adhesives could, for example, be silicone based or epoxy based adhesives.

As shown in FIG. 2, the lid 30 is attached to the housing member 22 by applying the adhesive 40 to the face 26 or, alternatively, to corresponding regions on the bottom surface 32 of the lid 30. The adhesive 40 is applied by known application methods and, as such, will not be described in greater detail. The lid 30 and the housing member 22 are pressed together until the adhesive 40 has bonded. Because the spacers 34 create a gap between the lid 30 and the face 26, the amount of adhesive 40 applied to the face 26 is pre-determined by the height of the spacers 34. The height of the spacers 34 is preferably such that the least amount of adhesive 40 is used while still maintaining optimal elastic and sealing characteristics. The adhesive 40 thereby simultaneously attaches the lid 30 to the housing member 22 and seals the housing 20.

Mechanical elements (not shown) may additionally be used to further attach the lid 30 to the housing member 22. The use of mechanical elements (not shown) can help to relieve the adhesive 40 from stress caused by the shearing forces. The mechanical elements may be, for example, plastic rivets, clamps, etc.

FIG. 3 shows an alternate embodiment of the constructional element 10. In the alternate embodiment, instead of the spacers 34, the amount of adhesive 40 applied to the face 26 is pre-determined by indentations 36 that receive the adhesive 40. The indentations 36 may be distributed evenly over the face 26 and are formed such that the least amount of adhesive 40 is used while still maintaining optimal elastic and sealing characteristics. Additionally, the face may be formed with both the spacers 34 and the indentations 36.

The foregoing illustrates some of the possibilities for practicing the invention. Many other embodiments are possible within the scope and spirit of the invention. For example, the face 26 may be formed to have step portions, and the lid 30 may be formed to rest directly or indirectly via the spacers 34 on one step of the face 26 and flush with an upper step of the face 26. Additionally, the face 26 may be formed to have step portions drawn inward such that the lid 30 is formed parallel to the base (not shown) of the housing member 22. Thus, the opening 28 defined by the face 26 and the lid 30 is smaller than a bottom face of the housing 20.

We claim:

1. A constructional unit, comprising:
   a frame;
   a cover being formed of a material with a different coefficient of thermal expansion than the frame;
   a plurality of spacers arranged between the frame and the cover, the spacers being formed to define a gap therebetween; and
   an adhesive provided in the gap that attaches the frame to the cover and simultaneously seals the gap.

2. The constructional unit of claim 1, wherein the adhesive is a hot-melt adhesive.

3. The constructional unit of claim 1, wherein the adhesive is a two-component adhesive.

4. The constructional unit of claim 1, wherein the adhesive is a reactively cross-linking adhesive.

5. The constructional unit of claim 1, wherein the adhesive is a polyamide based adhesive.

6. The constructional unit of claim 1, wherein the spacers are integrally formed with the frame.

7. The constructional unit of claim 1, wherein the frame is made of a plastic material and the cover is made of a metal material.

8. The constructional unit of claim 7, further comprising electronic components thermally coupled to the cover.

9. The constructional unit of claim 1, wherein the frame has at least one face defining an opening, the cover being attached to the face such that the cover covers the opening.

10. The constructional unit of claim 9, wherein the spacers extend perpendicular to the face.

11. The constructional unit of claim 9, wherein the spacers extend upward from the face toward the cover.

12. A constructional unit, comprising:
    a frame;
    a cover being formed of a material with a different coefficient of thermal expansion than the frame; and
    an adhesive provided between the frame and the cover that attaches the frame to the cover and seals a region between the frame and the cover, the region having indentations that provide repositories for the adhesive.

13. The constructional unit of claim 12, wherein the adhesive is a hot-melt adhesive.

14. The constructional unit of claim 12, wherein the adhesive is a two-component adhesive.

15. The constructional unit of claim 12, wherein the adhesive is a reactively cross-linking adhesive.

16. The constructional unit of claim 12, wherein the adhesive is a polyamide based adhesive.

17. The constructional unit of claim 12, wherein the indentations are formed in the frame.

18. The constructional unit of claim 12, wherein the frame is made of a plastic material and the cover is made of a metal material.

19. The constructional unit of claim 12, wherein the frame has at least one face defining an opening, the cover being attached to the face such that the cover covers the opening.

20. The constructional unit of claim 19, wherein the indentations are formed on the face.

* * * * *

UNITED STATES PATENT AND TRADEMARK OFFICE
CERTIFICATE OF CORRECTION

PATENT NO.        : 7,264,857 B2
APPLICATION NO. : 10/801753
DATED             : September 4, 2007
INVENTOR(S)       : Berchtold et al.

Page 1 of 1

It is certified that error appears in the above-identified patent and that said Letters Patent is hereby corrected as shown below:

On the cover page, item (73) Assignee, "Tyco Electronics Pretema GmbH & Co. KG, Niefern (DE)" should read -- Siemens Aktiengesellschaft, Munich (DE);
ZF Friedrichshafen AG, Friedrichshafen (DE); and Tyco Electronics AMP GmbH, Bensheim (DE) --

Signed and Sealed this

Eleventh Day of November, 2008

JON W. DUDAS
*Director of the United States Patent and Trademark Office*

UNITED STATES PATENT AND TRADEMARK OFFICE
CERTIFICATE OF CORRECTION

PATENT NO. : 7,264,857 B2  Page 1 of 1
APPLICATION NO. : 10/801753
DATED : September 4, 2007
INVENTOR(S) : Berchtold et al.

It is certified that error appears in the above-identified patent and that said Letters Patent is hereby corrected as shown below:

On the cover page, item (73) Assignee, "Tyco Electronics Pretema GmbH & Co. KG, Niefern (DE)" should read -- Siemens Aktiengesellschaft, Munich (DE); ZF Friedrichshafen AG, Friedrichshafen (DE); and Tyco Electronics AMP GmbH, Bensheim (DE) --

Signed and Sealed this

Twenty-fifth Day of November, 2008

JON W. DUDAS
*Director of the United States Patent and Trademark Office*

UNITED STATES PATENT AND TRADEMARK OFFICE
CERTIFICATE OF CORRECTION

PATENT NO. : 7,264,857 B2
APPLICATION NO. : 10/801753
DATED : September 4, 2007
INVENTOR(S) : Berchtold et al.

It is certified that error appears in the above-identified patent and that said Letters Patent is hereby corrected as shown below:

Title Pg, Item (73), Assignee, "Tyco Electronics Pretema GmbH & Co. KG, Niefern (DE)" should read -- Siemens Aktiengesellschaft, Munich (DE); ZF Friedrichshafen AG, Friedrichshafen (DE); and Tyco Electronics AMP GmbH, Bensheim (DE) --

Signed and Sealed this

Second Day of December, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,264,857 B2 |
| APPLICATION NO. | : 10/801753 |
| DATED | : September 4, 2007 |
| INVENTOR(S) | : Lorenz Berchtold et al. |

It is certified that error appears in the above-identified patent and that said Letters Patent is hereby corrected as shown below:

This certificate vacates the Certificates of Correction issued November 25, 2008 and December 2, 2008. The certificates are duplicates of the Certificate of Correction issued November 11, 2008. All requested changes were included in the Certificate of Correction issued November 11, 2008.

Signed and Sealed this

Thirtieth Day of December, 2008

JON W. DUDAS
*Director of the United States Patent and Trademark Office*